(12) United States Patent
Schumaker

(10) Patent No.: US 8,512,797 B2
(45) Date of Patent: *Aug. 20, 2013

(54) DROP PATTERN GENERATION WITH EDGE WEIGHTING

(75) Inventor: Philip D. Schumaker, Austin, TX (US)

(73) Assignee: Molecular Imprints, Inc., Austin, TX (US)

(*) Notice: Subject to any disclaimer, the term of this patent is extended or adjusted under 35 U.S.C. 154(b) by 702 days.

This patent is subject to a terminal disclaimer.

(21) Appl. No.: 12/580,813

(22) Filed: Oct. 16, 2009

(65) Prior Publication Data

US 2010/0098859 A1    Apr. 22, 2010

Related U.S. Application Data

(60) Provisional application No. 61/107,105, filed on Oct. 21, 2008.

(51) Int. Cl.
*B05D 5/00* (2006.01)

(52) U.S. Cl.
USPC ............ 427/8; 427/256; 427/261; 427/265

(58) Field of Classification Search
USPC ................. 427/277, 8, 256, 261, 265
See application file for complete search history.

(56) References Cited

U.S. PATENT DOCUMENTS

| | | | |
|---|---|---|---|
| 6,842,229 B2 | 1/2005 | Sreenivasan et al. | |
| 6,865,325 B2 | 3/2005 | Ide et al. | |
| 6,871,558 B2 | 3/2005 | Choi et al. | |
| 6,916,585 B2 | 7/2005 | Sreenivasan et al. | |
| 6,926,929 B2 | 8/2005 | Watts et al. | |
| 6,932,934 B2 | 8/2005 | Choi et al. | |
| 6,980,282 B2 | 12/2005 | Choi et al. | |
| 6,986,975 B2 | 1/2006 | Sreenivasan et al. | |
| 6,990,870 B2 | 1/2006 | Choi et al. | |
| 7,019,819 B2 | 3/2006 | Choi et al. | |
| 7,036,389 B2 | 5/2006 | Choi et al. | |
| 7,060,402 B2 | 6/2006 | Choi et al. | |
| 7,071,088 B2 | 7/2006 | Watts et al. | |
| 7,090,716 B2 | 8/2006 | McMackin et al. | |
| 7,110,085 B2 | 9/2006 | Zaal et al. | |
| 7,244,386 B2 | 7/2007 | Sreenivasan et al. | |
| 7,252,715 B2 | 8/2007 | Watts et al. | |
| 7,270,533 B2 | 9/2007 | McMackin et al. | |
| 7,281,919 B2 | 10/2007 | Shackleton et al. | |
| 7,298,456 B2 | 11/2007 | Cherala et al. | |
| 7,316,554 B2 | 1/2008 | Choi et al. | |
| 7,338,275 B2 | 3/2008 | Choi et al. | |
| 7,360,851 B1 | 4/2008 | Snyder | |

(Continued)

OTHER PUBLICATIONS

Du et al., Centroidal Voronoi Tessellations: Applications and Algprithm, Society for Industrial and Applied Mathernatices SIAM Review, pp. 637-676 Jan. 1, 1999.

(Continued)

*Primary Examiner* — Michael Cleaveland
*Assistant Examiner* — Alex A Rolland
(74) *Attorney, Agent, or Firm* — Cameron A. King

(57) ABSTRACT

Imprint lithography may comprise generating a fluid map, generating a fluid drop pattern, and applying a fluid to a substrate according to the fluid drop pattern. The fluid drop pattern may be generated using edge weighting through one or more modified Lloyd's method iterations to result in surface features being substantially filled with the fluid during imprint.

8 Claims, 12 Drawing Sheets

(56) References Cited

U.S. PATENT DOCUMENTS

| | | |
|---|---|---|
| 7,462,028 B2 | 12/2008 | Cherala et al. |
| 7,473,090 B2 | 1/2009 | McMackin et al. |
| 7,517,211 B2 | 4/2009 | Kruijt-Stegeman et al. |
| 7,565,219 B2 | 7/2009 | Van Der Schaar et al. |
| 2004/0163563 A1 | 8/2004 | Sreenivasan et al. |
| 2005/0061773 A1 | 3/2005 | Choi et al. |
| 2005/0072757 A1 | 4/2005 | McMackin et al. |
| 2005/0094212 A1* | 5/2005 | Asai et al. .................... 358/3.06 |
| 2005/0106321 A1 | 5/2005 | McMackin et al. |
| 2005/0189676 A1 | 9/2005 | Sreenivasan |
| 2005/0236739 A1 | 10/2005 | Willson et al. |
| 2005/0270312 A1 | 12/2005 | Lad et al. |
| 2005/0276919 A1 | 12/2005 | Truskett et al. |
| 2006/0063112 A1 | 3/2006 | Sreenivasan |
| 2006/0076717 A1 | 4/2006 | Sreenivasan et al. |
| 2006/0077374 A1 | 4/2006 | Sreenivasan et al. |
| 2006/0115999 A1 | 6/2006 | Sreenivasan et al. |
| 2006/0121728 A1 | 6/2006 | McMackin et al. |
| 2006/0177532 A1 | 8/2006 | Fletcher et al. |
| 2006/0177535 A1 | 8/2006 | McMackin et al. |
| 2007/0063384 A1 | 3/2007 | Choi et al. |
| 2007/0114686 A1 | 5/2007 | Choi et al. |
| 2007/0126150 A1 | 6/2007 | GanapathiSubramanian et al. |
| 2007/0132152 A1 | 6/2007 | Choi et al. |
| 2007/0141271 A1 | 6/2007 | Xu et al. |
| 2007/0170617 A1 | 7/2007 | Choi et al. |
| 2007/0228593 A1 | 10/2007 | Jones et al. |
| 2007/0228608 A1 | 10/2007 | Shackleton et al. |
| 2007/0228610 A1 | 10/2007 | Sreenivasan et al. |
| 2007/0243279 A1 | 10/2007 | McMackin et al. |
| 2007/0246850 A1 | 10/2007 | Schumaker |
| 2007/0278712 A1* | 12/2007 | Okushima et al. ............ 264/236 |
| 2008/0028360 A1 | 1/2008 | Picciotto et al. |
| 2008/0141862 A1 | 6/2008 | Xu et al. |
| 2008/0153312 A1 | 6/2008 | Sreenivasan et al. |
| 2008/0174046 A1 | 7/2008 | Choi et al. |
| 2008/0199816 A1 | 8/2008 | Choi et al. |
| 2008/0303187 A1 | 12/2008 | Stacey et al. |

OTHER PUBLICATIONS

PCT/US08/08467 International Search Report, Jan. 6, 2009.
Secord, Weighted Voronoi Stippling, NPAR 2002, Symposium on Non-Photorealistic Animation and Rendering, Annecy, France; Jun. 3, 2002, pp. 37-43 Jun. 3, 2002.
PCT/US2009/005688 International Search Report, Jan. 22, 2010.

\* cited by examiner

DROP PATTERN GENERATION WITH EDGE WEIGHTING

PRIORITY AND RELATED APPLICATION

The present application claims priority to and is related to U.S. Provisional Application Ser. No. 61/107,105, entitled, "Drop Pattern Generation With Volume Weighting For Imprint Lithography" to Philip D. Schumaker, filed on Oct. 21, 2008; which is incorporated by reference herein for all that it teaches and discloses.

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976; U.S. Patent Application Publication No. 2004/0065252; and U.S. Pat. No. 6,936,194, entitled "Functional Patterning Material for Imprint Lithography Processes," all of which are hereby incorporated by reference.

An imprint lithography technique disclosed in each of the aforementioned U.S. patent publications and patent, includes formation of a relief pattern in a polymerizable layer and transferring a pattern corresponding to the relief pattern into an underlying substrate. The substrate may be coupled to a motion stage to obtain a desired positioning to facilitate the patterning process. The patterning process uses a template spaced-apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced-apart. The substrate and the solidified layer are then subjected to additional processes to transfer a relief image into the substrate that corresponds to the pattern in the solidified layer.

DETAILED DESCRIPTION

Figure 1:
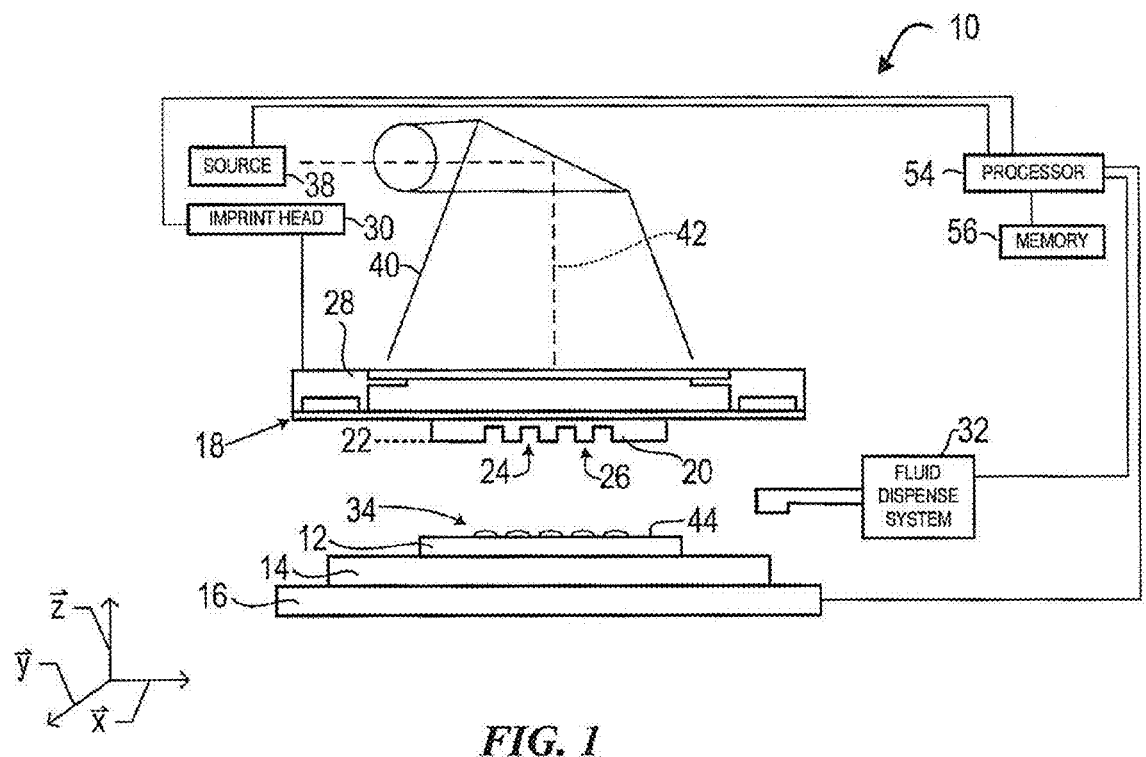
FIG. 1 is a simplified side view of a lithographic system having a mold spaced-apart from a substrate.

Referring to the figures, and particularly to FIG. 1, illustrated therein is a lithographic system 10 used to form a relief pattern on a substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to template chuck 28. Template chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, template chuck 28 may be coupled to imprint head 30 such that template chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 22 and substrate 12 depending on design considerations.

Polymerizable material 34 may comprise a monomer mixture as described in U.S. Pat. No. 7,157,036 and U.S. Patent Publication No. 2005/0187339, all of which are hereby incorporated by reference.

Figure 2:
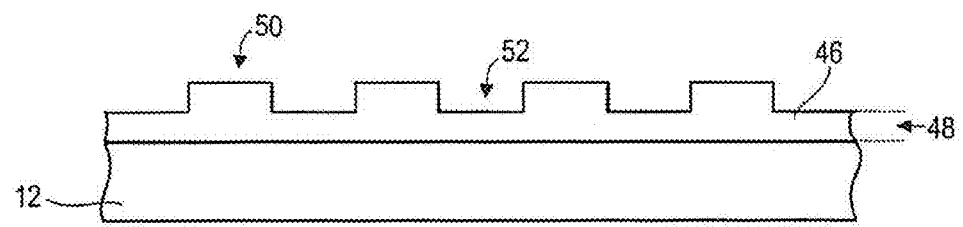
FIG. 2 is a side view of the substrate shown in FIG. 1, having a patterned layer thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both may vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness t1 and residual layer having a thickness t2.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

One manner in which to locate the polymerizable material 34 between template 18 and substrate 12 may be by depositing a plurality of droplets of polymerizable material 34 on the surface 44 of substrate 12. Thereafter, polymerizable material 34 may be concurrently contacted by both template 18 and substrate 12, spreading polymerizable material 34 on the surface of substrate 12. During this process, orientation of template 18 to substrate 12 may become a factor.

In a further embodiment, the above-mentioned may be employed in any known technique, e.g., photolithography (various wavelengths including G line, I line, 248 nm, 193 nm, 157 nm, and 13.2-13.4 nm), contact lithography, e-beam lithography, x-ray lithography, ion-beam lithography and atomic beam lithography.

Current imprint lithography systems and methods, as described in United States Patent Application Publication No. 2005/0270312, filed as U.S. patent application Ser. No. 11/143,092 entitled "Fluid Dispensing and Drop-On-Demand Dispensing for Nano-Scale Manufacturing" and United States Patent Application Publication No. 2005/0106321, filed as U.S. patent application Ser. No. 10/714,088 entitled "Dispense Geometry to Achieve High-Speed Filling and Throughput," both of which are incorporated by reference herein, use drop-on-demand technology to place drops of polymerizable material on a substrate before imprinting. The fluid dispenser dispenses fluid in discrete volumes and at discrete locations. This method is useful for any imprint system using drop-on-demand application with these constraints.

U.S. Patent Application Publication No. 2007/0141271, which is hereby incorporated by reference herein, describes a method of controlling the distribution of fluid on a body. The method includes generating a sequence of patterns of liquid upon a substrate, each sequence including a plurality of spaced-apart liquid regions, with voids defined between adjacent liquid regions. A second of the patterns of liquid of the sequence is arranged so that the liquid regions associated therewith are in superimposition with the voids of a first of the patterns of liquid of the sequence.

As described herein, a fluid drop pattern can be generated for use with an imprinting (e.g., patterning) surface in an imprint lithography process. When polymerizable material is applied to the substrate according to the drop pattern, the polymerizable material substantially completely fills features of the imprinting surface during the imprinting process. After polymerization, the imprinting surface is successfully replicated in the patterned layer (e.g., the size and shape of the protrusions in the patterned layer substantially match the size and shape of the corresponding recesses in the imprinting surface, if present) and the residual layer is of a desired, substantially uniform thickness.

As used herein, "drop location" is an x,y coordinate in a Cartesian plane $R^2$. The set of available locations G is determined by the dispense hardware and the dispensing strategy. The dispensing strategy encompasses the number of physical dispensers, or heads, in the system and the number of stage passes allowed.

A fluid map M comprises a three-dimensional (3D) grid of voxels or volumetric pixels. Each element of the grid represents a two-dimensional location along the x,y coordinates as well as the fluid volume requirement for that grid location. Each dispenser has an ideal volume $v_{ideal}$, however the effective dispensed volume may be different. The variations are due to assembly and machining variations in the dispenser itself and evaporation of the fluid after it has been dispensed. The amount of evaporation, or volume loss, is related to the chemical composition of the fluid, localized air velocities, and the spatial distribution of the fluid on the wafer. These effects can be modeled and corrected for by applying a volume transformation function $f$ to the fluid map. In some cases, this function is an identity transform. In a simple transform, $f$ applies a scalar correction to requested volume.

Given a fluid map M, a drop volume function $f$, and a set of possible drop locations G, a goal is to identify the places P, where $P \subset G$, which should be used to place the drops to match the spatial volume distribution specified in M. More formally, P is a solution to the following optimization problem.

$$\text{minimize} \sum_{i=1}^{n} \|p_i - z_i\|_2^2 \quad (1)$$

$$\text{subject to} \sum_{k \in \Omega_i} f(M_k) = v_{ideal} \quad (2)$$

$$p \subset G \quad (3)$$

where The convex set of voxels allocated to drop i is $\Omega_i$

The (x, y) location of voxel k is $x_k$

The volume weighted centroid of drop i is $$z_i = \frac{\sum k \in \Omega_i f(M_k) x_k}{\sum k \in \Omega_i f(M_k)}$$

As shown by Aurenhammer et al. in "Minkowski-type theorems and least-squares partitioning" *Proc. 8$^{th}$ ACM Symp. Computational Geometry* (1992), 350-357, which is hereby incorporated by reference herein, this problem, which is commonly known as a least-squares assignment problem, can be solved by finding the optimal power diagram. Solving this problem may comprise the following steps:

1. Determine the number of drops n needed to satisfy $$M \text{ where } n = \frac{1}{v_{ideal}} \sum_i^R \sum_j^C f(M, i, j)$$

2. Select a starting subset of $P_0$ of G such that $n=\|P_0\|_0$
3. Set l=0 then repeat until converged
    1. Compute power diagram of $P_l$ given map M
    2. Set $P'_{l+1}$ to the volume weighted centroid of each region
    3. Set $P_{l+1}$ to the snapped $P'_{l+1}$ locations of G
    4. Increment l.

Steps 1 and 3 above solve a relaxed version of the optimization problem by analyzing the problem in the continuous domain. Step 3 discretizes the continuous solution P' and generates a physically realizable solution P by enforcing the second constraint as shown in equation (3) above.

The progression of the solution can be monitored by tracking the value of the objective function and by tracking the distribution of volumes. The criteria for convergence may be based on elapsed time, the value of the objective function, the value of the constraints exceeding a threshold, etc. The final solution P is considered to be optimal for residual layer thickness uniformity because the volume requirements described in M are substantially met.

The procedure to build a power diagram is similar to the procedure to build a Voronoi diagram. A Voronoi diagram is a decomposition of a metric space which is determined by distances to a specified discrete set of objects in the space. One difference between the power diagram and the Voronoi diagram is that in the power diagram each generator location has an associated weight $\lambda_i$. At the start of the procedure the weights are initialized to 0.0 and are then updated according to equation (4) below:

$$\lambda_{l+1,i} = \lambda_{l,i} + a\left(\frac{\sum_{k \in \Omega_{l,i}} f(M_k)}{v_{ideal}} - 1\right) \qquad (4)$$

The scaling factor of α is used to give the weights a value which is similar to the typical inter-drop distance.

When building a Voronoi diagram, the voxels in M are partitioned into the regions $\Omega_i$ based on equation (5) where the voxel is assigned to the closest generator in P:

$$\|p_i - x_k\|_2 \qquad (5)$$

but with the power diagram the voxels are assigned to closest weighted generator as shown in equation (6).

$$\|p_i - x_k\|_2 + \lambda_i \qquad (6)$$

Figure 3:
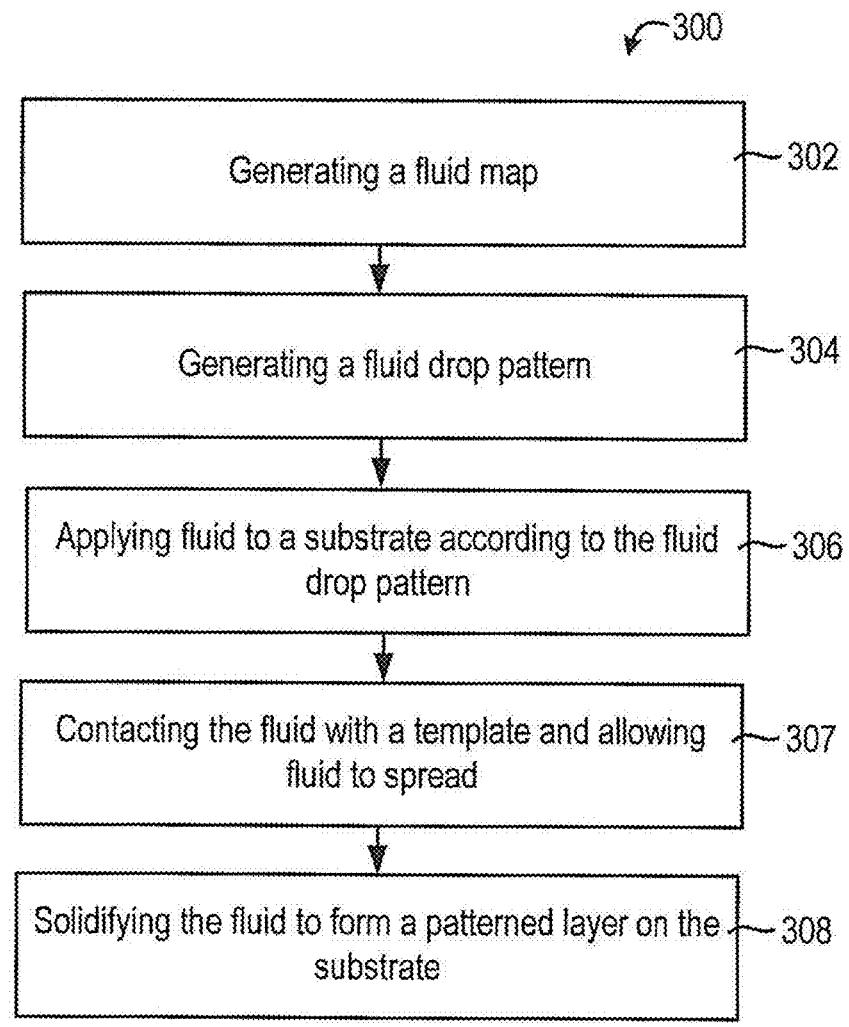
FIG. 3 a flow chart showing a process for replicating an imprinting surface in an imprint lithography process.

FIG. 3 is a flow chart showing a process 300 of replicating an imprinting surface in imprint lithography. Block 302 generates a fluid map. Block 304 generates a fluid drop pattern. Generating the fluid drop pattern includes starting with an initial set of drop locations, factoring in considerations described above (e.g., drop dispenser locations), and adjusting theoretical drop locations to be compatible with this and other equipment constraints and to minimize template effects such as surfactant buildup. Block 306 applies fluid to a substrate according to the fluid drop pattern. Block 307 contacts the fluid with a template to spread the fluid 308. Block 308 solidifies the fluid to form a patterned layer on the substrate. The fluid may be, for example, a polymerizable material which solidifies upon application of ultraviolet light.

Figure 4:
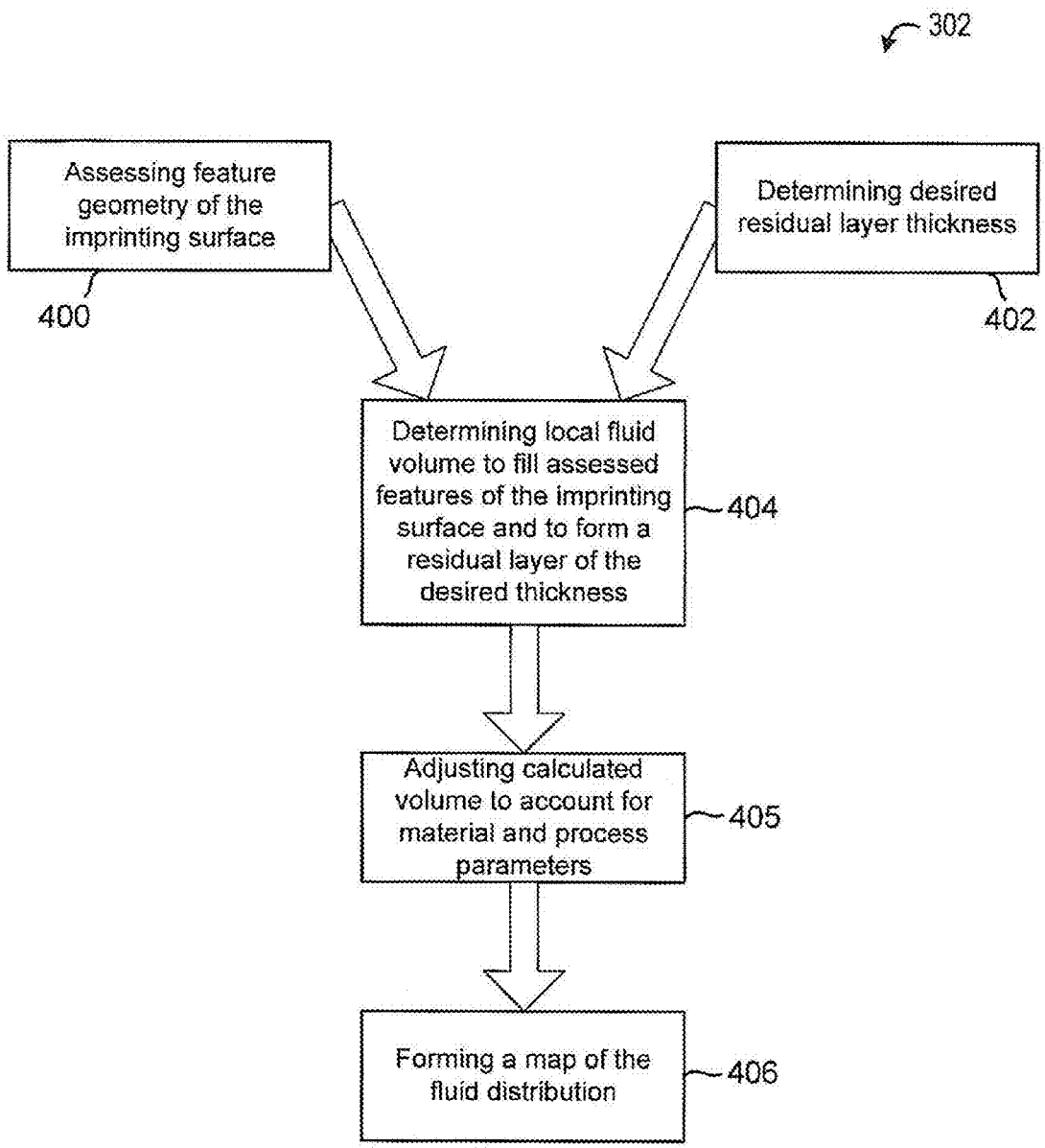
FIG. 4 is a flow chart that depicts generating a fluid map.

FIG. 4 is a flow chart showing the process 302 of generating the fluid map in additional detail. Block 400 assesses the feature geometry of the imprinting surface. Block 402 determines the desired residual layer thickness 402. Block 404 determines the local fluid volume needed to fill the assessed features of the imprinting surface and to form a residual layer of the desired thickness. Block 405 assesses properties of the fluid (e.g., shrinkage of polymerizable material), the substrate (e.g., surface energy), the fluid applicator (e.g., calibration parameters, drop volumes, drop placement, etc.), other process parameters, and any combination thereof, and incorporating this information into the formation of a fluid distribution map. Block 406 forms a map of the fluid distribution (e.g., a fluid map representing local fluid volume needed) that will allow successful replication of the imprinting surface in an imprint lithography process. Properties of the fluid (e.g., evaporation, shrinkage of polymerizable material), the substrate (e.g., surface energy), and the fluid applicator (e.g., calibration parameters, drop volumes, dispenser locations, etc.), may be used in generating the fluid map.

Figure 5:
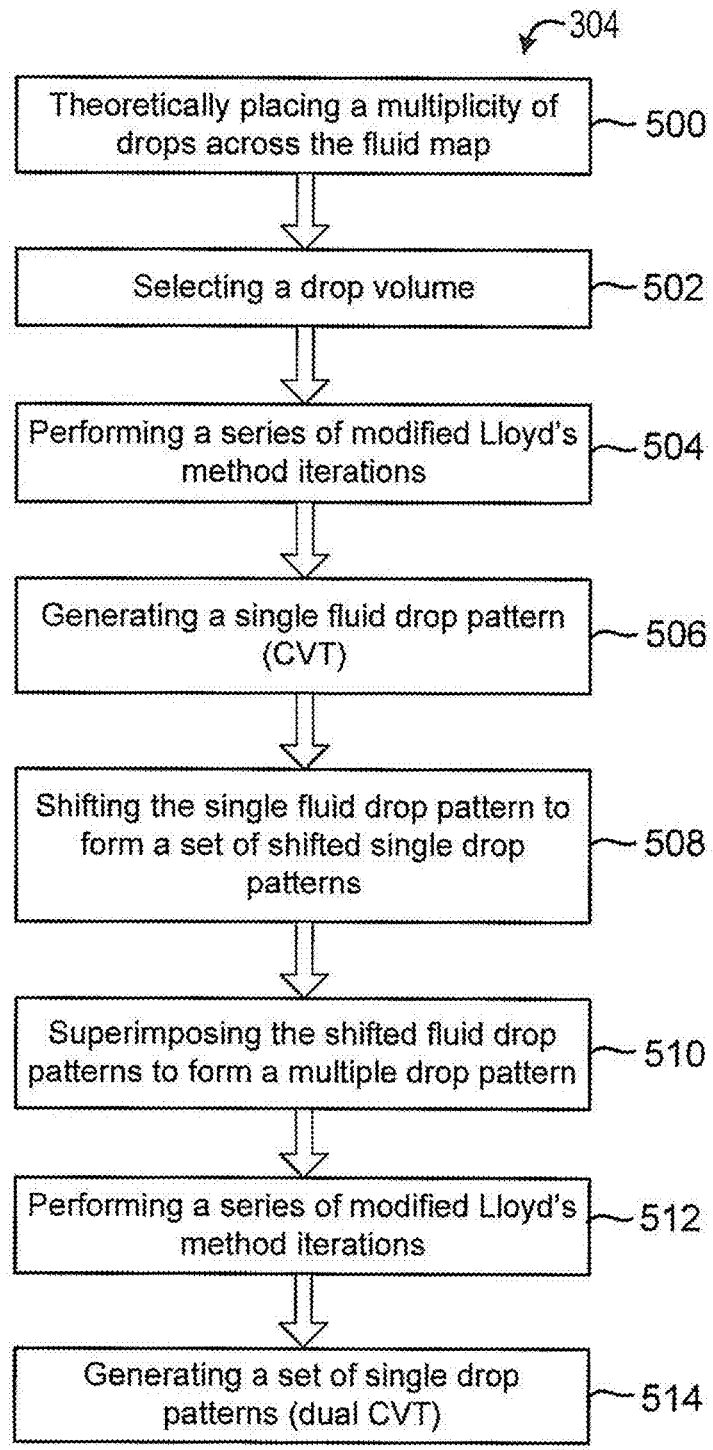
FIG. 5 is a flow chart that depicts generating a fluid drop pattern from a fluid map.

FIG. 5 is a flow chart depicting the process 304 of generating a fluid drop pattern from a fluid map for a selected imprint area. Block 500 places a multiplicity of drops across the fluid map. In some cases, no two drop locations map to the same fluid map cell. Block 502 selects a fixed drop volume. The fixed drop volume may be determined by the drop applicator. The fixed drop volume and number of drops are selected such that the sum of drop volumes of the multiplicity of drops is substantially equal to the sum of the cell volumes in the fluid map. In some cases, generating a fluid drop pattern is expedited by selecting an initial drop pattern that at least roughly corresponds to the fluid distribution in the fluid map.

When the fluid map represents a substantially uniform volume distribution (e.g., the imprinting surface is substantially "unpatterned," or without intentional protrusions and recesses), the fluid volume associated with each fluid map cell can be substantially the same. When the fluid map represents a non-uniform volume distribution (e.g., the imprinting surface is "patterned," or with intentional protrusions and recesses), however, fluid volume associated with a fluid map cell may vary based upon the features of the imprinting surface associated with the cell. In this case, the volume of the theoretical drop chosen to fill the fluid map cell may vary based upon the features of the imprinting surface associated with the cell and the size of the cell.

To allow for a substantially uniform drop volume in the fluid drop pattern, as required by some fluid applicators, while achieving the desired non-uniform volume distribution in the imprinting area, block 504 may perform a series of modified Lloyd's method iterations. Lloyd's method is described in "Random Marks on Paper, Non-Photorealistic Rendering with Small Primitives," Adrian Secord, Master's Thesis, The University of British Columbia, October 2002, which is incorporated by reference herein. This method includes computing the Voronoi diagram of the generating points in the imprinting area, computing the centroid of each Voronoi region in the diagram, and moving each generating point to its centroid.

The modified Lloyd's method iterations used herein involve computing the Voronoi tessellation of the drop pattern (that is, breaking it into regions that are closer to that drop than any other). Then, instead of moving the drop to the center of mass of its Voronoi region as with Lloyd's method, the drop is moved to a location that coincides with a weighted mean of all of the Voronoi region centers of mass. Each center of mass is weighted based on its volume deficit and the distance between the centers of mass of the Voronoi regions of the two drops. This modification to Lloyd's method allows the drop locations to converge to a result in which drop densities approximate the fluid density in the underlying fluid map. Without this modification to Lloyd's method, drops converge to a solution that is well-spaced, but that does not necessarily fit the underlying fluid density changes.

The modified Lloyd's method iterations transform the drop distribution based on fluid map cells to a distribution based on an approximate centroidal Voronoi tessellation in which the volume of the modified fluid map cells (now Voronoi regions) associated with a drop location is close to a fixed volume. Iterations may continue until a user intervenes, a convergence criterion is met, or a pre-determined length of time has elapsed. Block 506 generates a single fluid drop pattern following convergence of the optimization method.

If the starting set $P_0$ is generated deterministically, then there will be a single unique solution. However if the starting point $P_0$ is determined randomly, then the solutions will be similar but different. In this way, the inability of the procedure to find the global optimum can be exploited to generate a set of drop patterns with similar qualities that use different subsets of G.

The single drop pattern generated in the centroidal Voronoi tessellation (CVT) process may be used to form additional drop patterns, each of which may be used independently (e.g., in a random or selected order during successive fabrication steps) to provide desired coverage of an imprinting surface. For example, a single drop pattern may be duplicated and translated a distance a first direction. Block 508 shifts the single fluid drop pattern to form a set of shifted single drop patterns. Multiple shifted drop patterns can be formed by duplicating and translating the single drop pattern in one or more additional directions (e.g., a second, third, or fourth direction). The shifted drop patterns may then be superimposed to form a multiple drop pattern 510, retaining the association of each drop with the drop pattern from which it originated.

Block 510 may superimpose the shifted fluid drop pattern to form a multiple drop pattern. Block 512 may then perform a second optimization, or round of modified Lloyd's method iterations in a dual CVT process. This second optimization causes the shifted drop locations to spread to a uniform distance, approximating the initial fluid map.

Block 514 generates a multiple fluid drop pattern following the second iteration and convergence of the modified Lloyd's method. The multiple fluid drop pattern may then be deconstructed such that each drop location is associated with the shifted pattern from which it originated. This process yields, for example, four adjusted shifted patterns that can be implemented successively or in any desired order. To reduce effects such as non-uniformity and surfactant buildup during successive imprints, the shifted patterns can be combined with (e.g., alternated with) individual iterations on each drop pattern, and appropriate weighting factors can be applied to each type of iteration. Use of a set of adjusted single drop patterns can also promote more complete expelling of gases from interstitial regions between drops during repeated imprinting.

When a multiple drop pattern is not advantageous, a single drop pattern may be used, and the formation of shifted drop patterns is not necessary. Whether one drop pattern or multiple drop patterns is used, after iterations are complete, fluid is applied to a substrate 306 according to the selected fluid drop pattern, with each drop matched to an available (e.g., the nearest available) fluid dispenser location, as determined during the iterative optimization process. The fluid, deposited according to the fluid drop pattern, is then contacted with an imprinting surface and polymerized 308 to form a polymerized layer on a substrate.

Figure 6A:
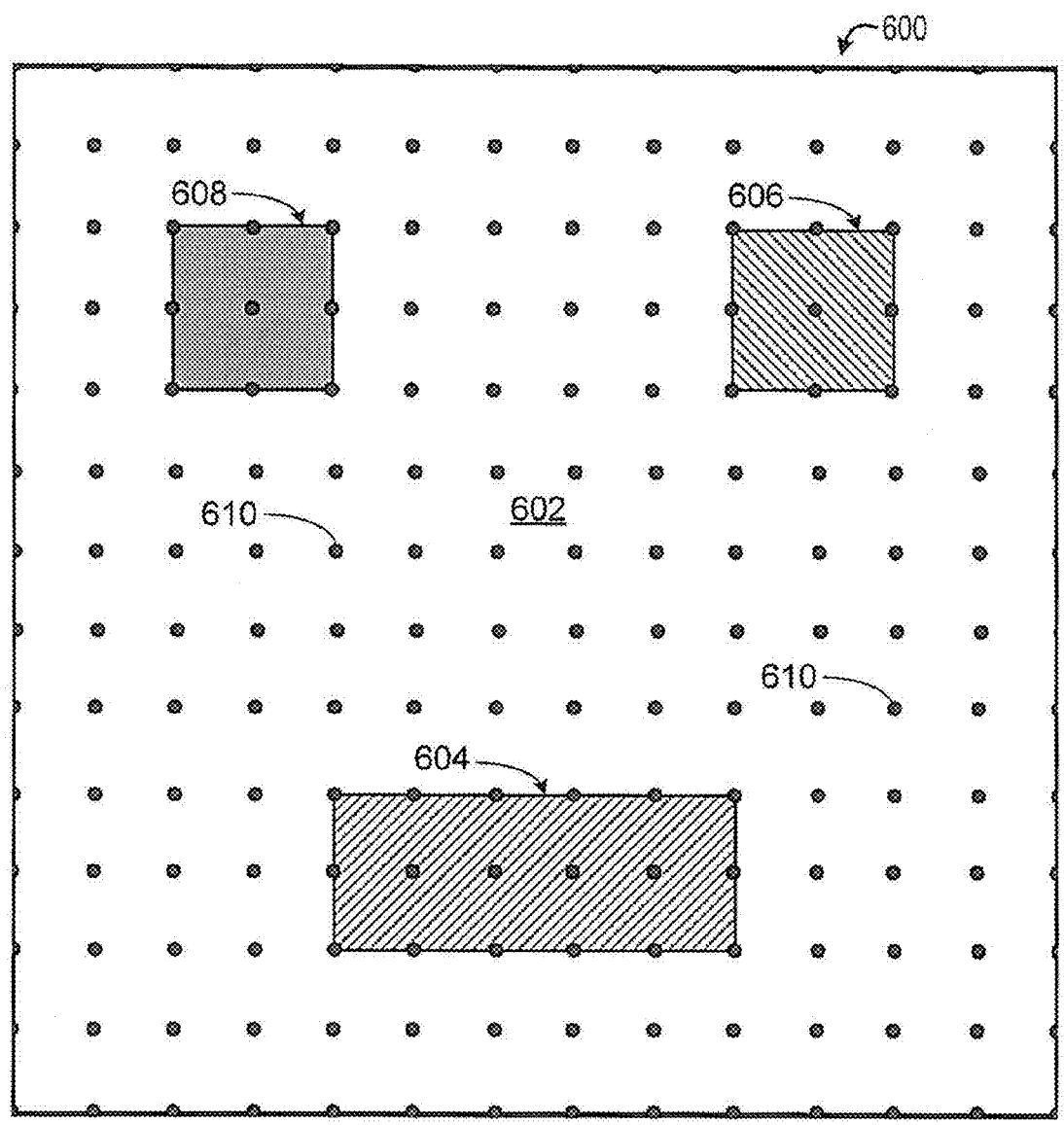
FIG. 6A shows a fluid map and initial drop locations for a patterned surface.
Figure 6B:
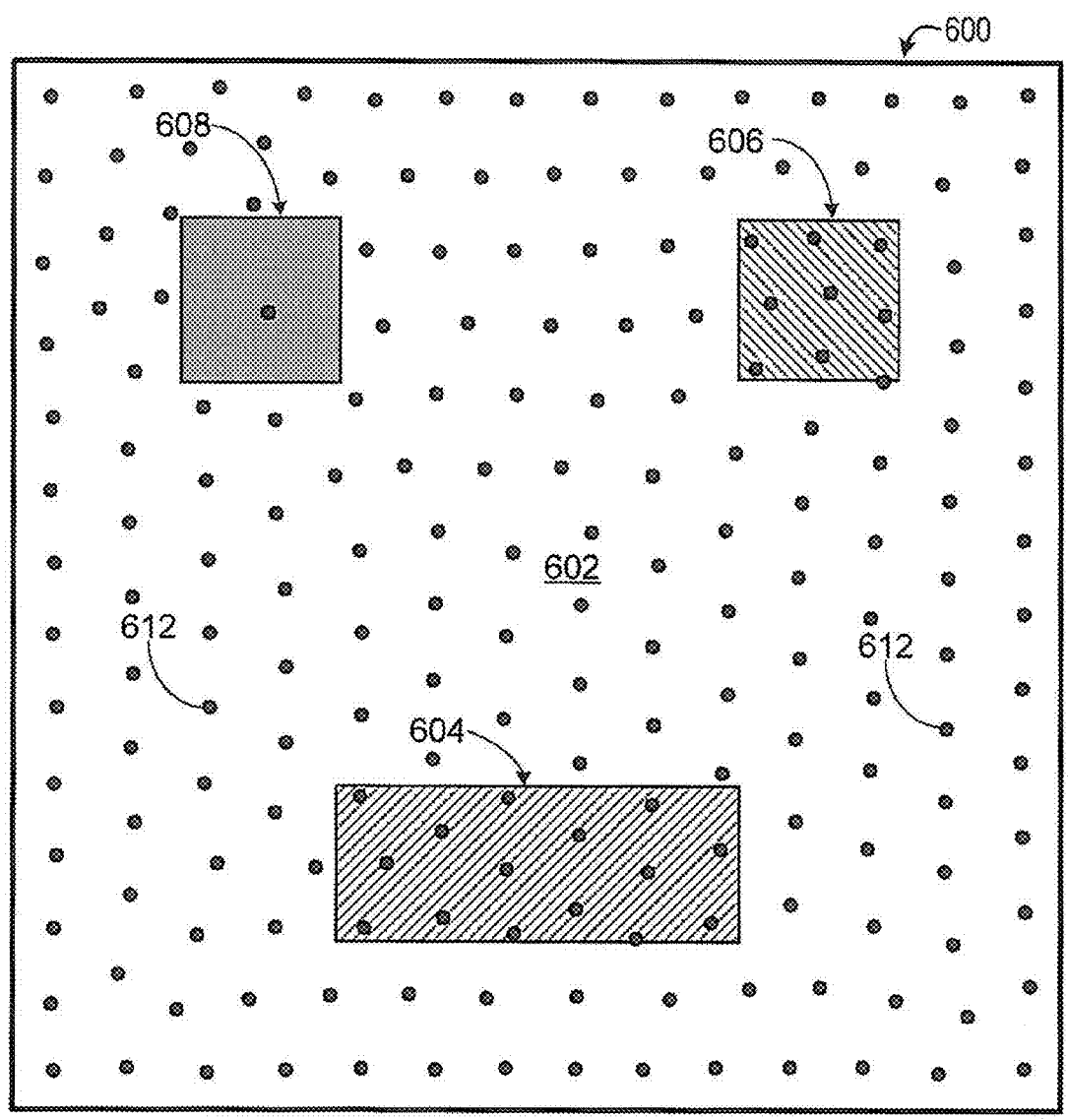
FIG. 6B shows optimized drop locations for the patterned surface in FIG. 6A.

FIG. 6A shows a representation of a fluid map 600. Within fluid map 600 are several regions: region 602 having a substantially uniform depth, region 604 which is recessed with respect to region 602, region 606 which is more deeply recessed with respect to region 602, and region 608 which protrudes with respect to region 602. Initial drop locations 610 are evenly spaced. Optimization, or application of the modified Lloyd's method, yields optimized drop locations as shown in FIG. 6B below at 612, with an increased drop density in regions 604 and 606 and a reduced drop density in region 608 compared to the drop density in region 602.

Figure 6C:
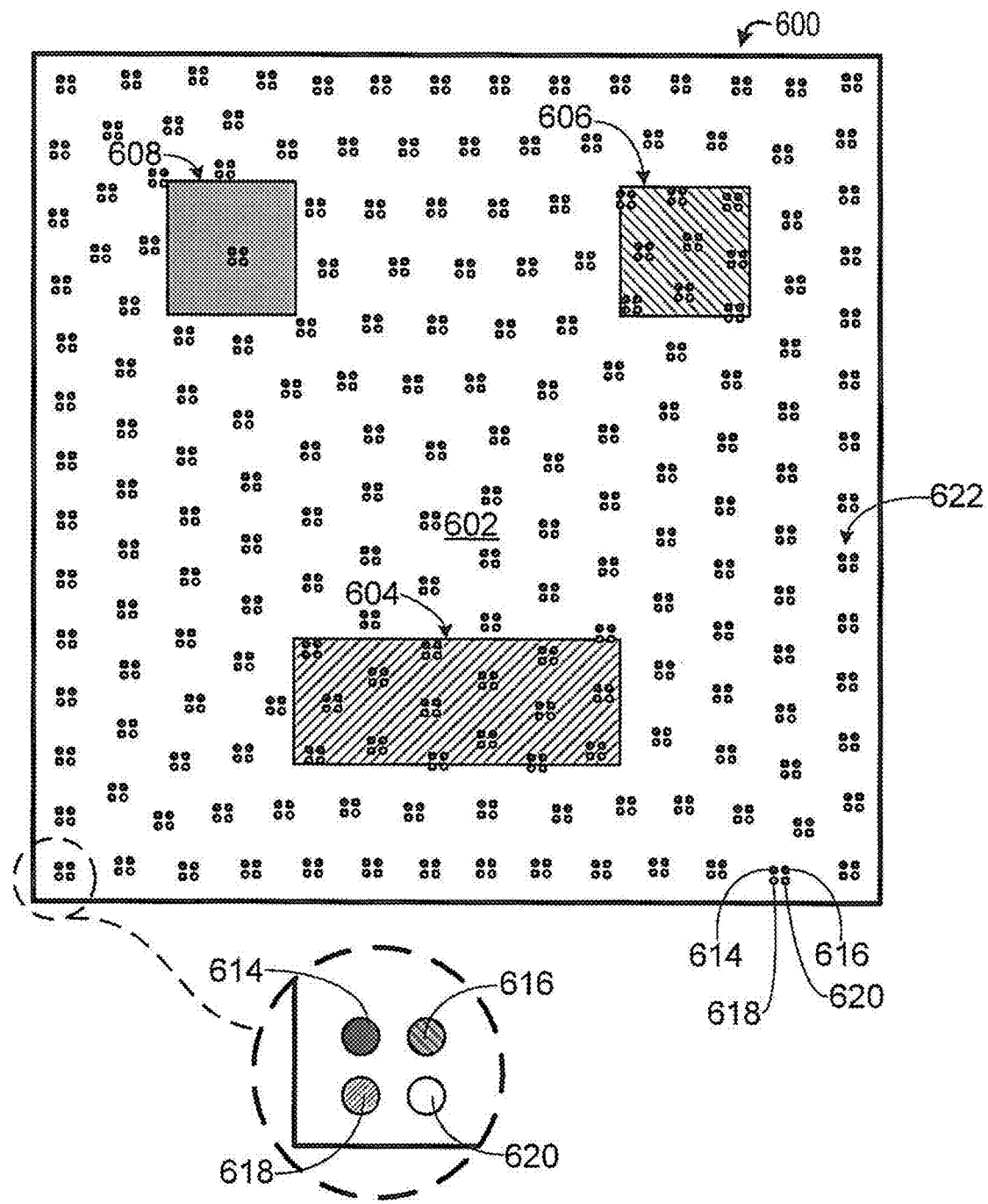
FIG. 6C shows shifted single drop patterns created from the single drop pattern in FIG. 6B and superimposed to form a multiple drop pattern.
Figure 6D:
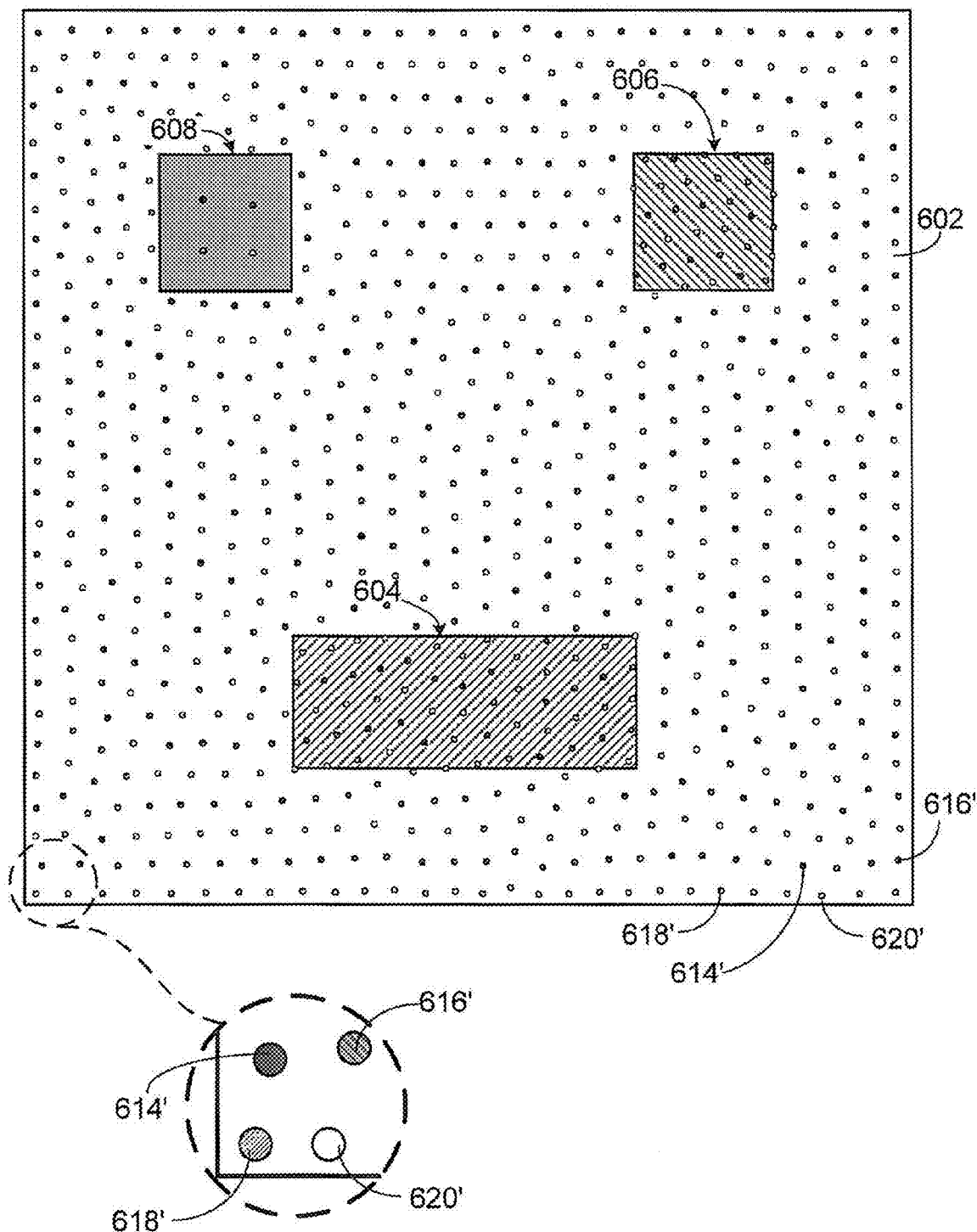
FIG. 6D and FIG. 6E show the multiple drop pattern in FIG. 6C after undergoing an optimization process.
Figure 6E:
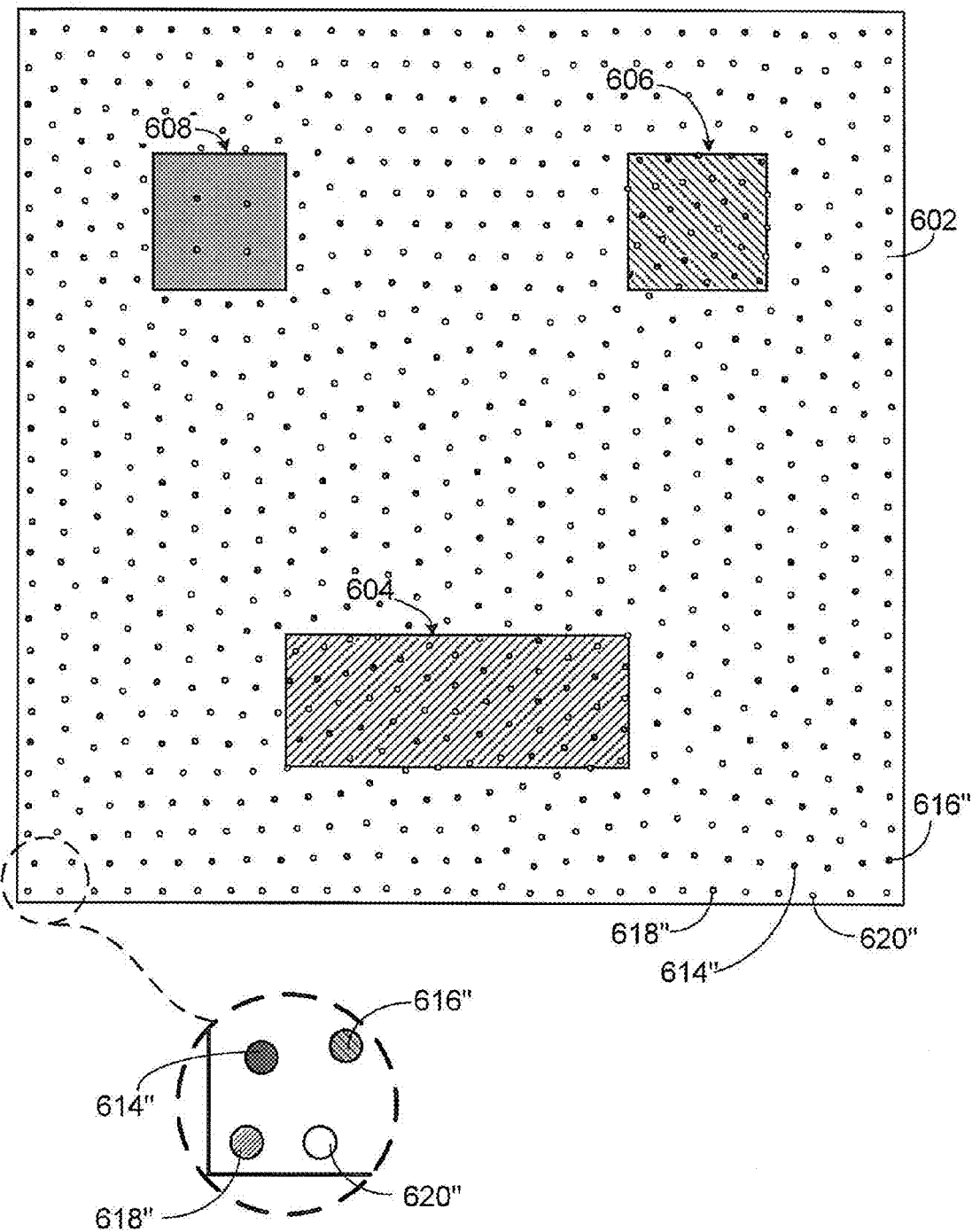

A multiple drop pattern may be formed from any number of superimposed single drop patterns (e.g., four). Referring to FIG. 6C, drops 612 are duplicated and shifted in four different directions to form four single drop patterns represented by drop locations 612, 614, 616, and 618. Multiple drop pattern 620 is formed by superimposing the four single drop patterns. A second consecutive iterative process (dual CVT) is applied to multiple drop pattern 620 to optimize drop locations in the shifted single drop patterns 612, 614, 616, and 618 with respect to each other to form adjusted shifted single drop patterns 612', 614', 616', and 618', respectively, shown in FIG. 6D. This optimization can be used to adjust relative positioning of the drop locations in the shifted single drop patterns to reduce undesirable template effects such as surfactant buildup from successive imprinting with overlapping drop locations. Optimization may also include a step to "snap" a calculated drop location to a fluid dispenser location.

The adjusted single drop patterns 612', 614', 616', and 618' may be used individually in any order, along with any desired variations of the adjusted single drop patterns, to apply fluid to a substrate for successive imprinting during fabrication. For example, a first subset (e.g., one-fourth) of the drops depicted in FIG. 6D may be applied to a substrate during fabrication. In subsequent processes, a second subset of the drops depicted in FIG. 6D may be applied to another substrate during fabrication, and so forth, such that different dispenser locations are used in a random or rotating sequence of the four adjusted single drop patterns.

The efficacy of a drop pattern can be quantified by the distribution of fluid volumes in Voronoi regions. Convergence criteria may take the form of maximum Voronoi region volume or standard deviation of Voronoi region volumes. This may also be used to quantify error induced by producing shifted drop patterns and by matching (or "snapping") theoretical drop locations in a drop pattern to fluid dispenser or applicator locations.

Figure 7:
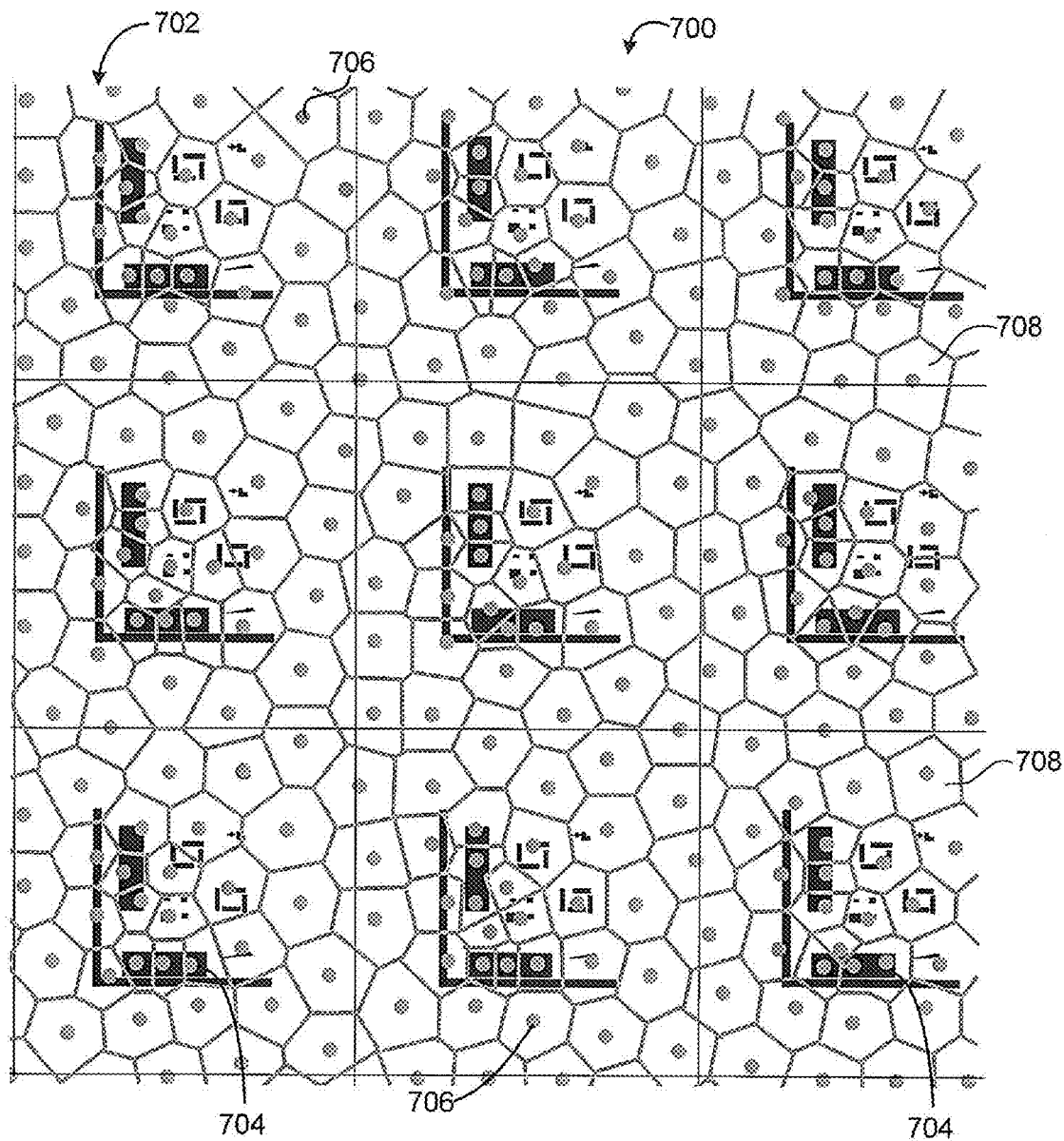
FIG. 7 shows a single drop pattern for a complex patterned region generated by a centroidal Voronoi tessellation (CVT) process.

FIG. 7 shows fluid map 700, with a single drop pattern 702 generated by a CVT process. Fluid map 700 includes nine substantially similar cells, with shaded regions indicating features 704 in the imprinting surface. Other regions of the fluid map correspond to substantially unpatterned regions of the imprinting surface, and require an effective amount of fluid to form the desired residual layer. Drop locations 706 are shown in Voronoi regions 708. As indicated in FIG. 7, drop density is higher proximate features 704 of the fluid map 700 (i.e., proximate regions with features in the imprinting surface).

As seen in FIG. 7, Voronoi regions 708 are not always centered on features 704 of the fluid map 702. In particular, drops that are primarily allocated to features 704 may not line up along Cartesian directions of the features. In some cases, features in a fluid map may be identified and drop patterns generated such that drop locations are substantially aligned with the features, allowing more rapid filling of features for higher throughput in the imprint lithography process.

Figure 8:
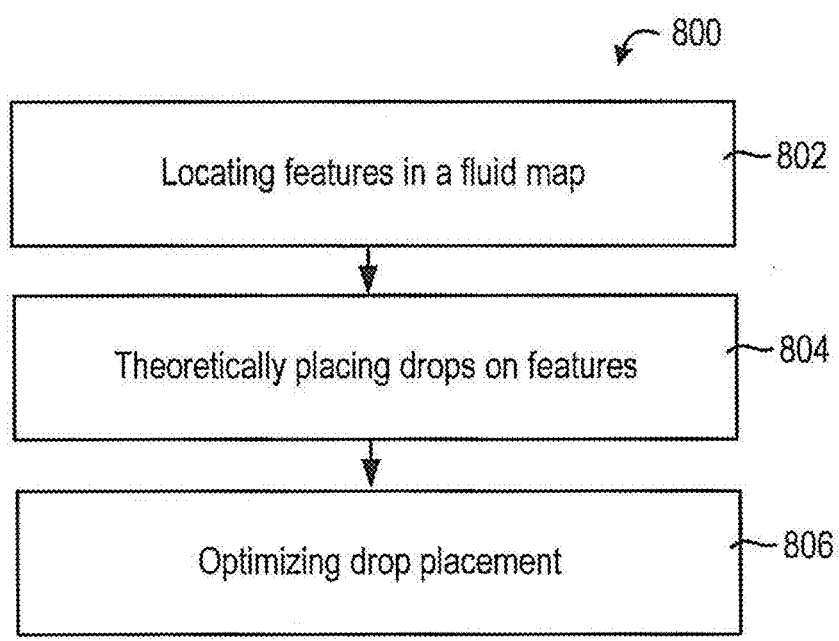
FIG. 8 is a flow chart showing a process for placing fluid drops on features of interest in a complex patterned region.

Drop patterns with drop locations substantially aligned with the features may be calculated by methods including power centroidal Voronoi tessellation (PCVT). FIG. 8 is a flow chart of the process of PCVT 800. Block 802 locates features in a fluid map. Block 804 theoretically places, or otherwise simulates, drops on features. Block 806 optimizes drop placement. In one implementation, blocks 802-806 may execute the following sequence:

1. Generate a list $L_{all}$ of all discrete features in M
2. Apply a first rule set $r_I$ to target a subset of import features $L_I = r_I(L_{all})$ 3. Apply a second rule set $r_{nc}$ to identify non-convex features $L_{nc} = r_{nc}(L_I)$ such that $L_I = L_C \cup L_{nc}$ 4. For each non-convex feature in $L_{nc}$
   i. Try to split the feature into convex sub-features $L_{sub} = ncut(L_{nc_i})$ ii. Apply $r_I$ to $L_s$ to find $L_{sub_I}$ $L_{sub_I} = r_I(L_{sub})$ iii. Apply $r_{nc}$ again to identify non-convex features. Repeat steps i. and ii. until all features are convex
   iv. Append the new set of convex sub-features to set of all convex features $L_c = L_c \cup L_{sub_I}$ 5. Set F'={ } then for each feature in $L_c$
   i. Apply a third rule set $r_s$ to split the feature into a regular grid of sub-features
   ii. Place at drop d on the centroid of each sub-feature
   iii. Append the drop location to the set of feature drops $F' = F' \cup d$ 6. Set F to the snapped drop locations F' of G
7. Calculate the number of additional drops m needed to satisfy the volume requirements of M $$m = \frac{1}{v_{ideal}} \sum_{i}^{R} \sum_{j}^{C} f(M, i, j) - \|F\|_0$$

8. Select a starting subset $R_0$ of G such that $m = \|R_0\|_0$
9. $P_0 = F \cup R_0$
10. Set l=0 then repeat until converged
    i. Compute the power diagram of the given map M with generators $P_l$
    ii. Set $R'_{l+1}$ to the volume weighted centroid of each region for the drops in $R_0$
    iii. Set $R_{l+1}$ to the snapped $R'_{l+1}$ locations of G
    iv. $P_{l+1} = F \cup R_{l+1}$
    v. Increment l.

In block 802, "features" may be considered regions of local similarity. Therefore finding features in the fluid map may be framed as an unsupervised clustering problem. There are numerous clustering methods such as spectral clustering, k-means clustering, and so forth. One method of clustering which may be applied is described below:

Inputs:
  A pixel neighborhood function Ω.
    Default is North, South, East, West
  A fluid map M with n=r×c voxels
  A volume change threshold σ
Output:
  A k×n matrix with n non-zero values where the sum of each column is 1. The voxels assigned to the $k^{th}$ feature have 1's on the $k^{th}$ row.
Procedure:
1. Build an affinity matrix A from M
   A is n×n in size
   where $$A_{i,j} = \begin{cases} e\left(\frac{-|M_i - M_j|^2}{\sigma^2}\right) & j \in \Omega_i \\ 0 & \text{otherwise} \end{cases}$$

2. Perform a depth first traversal of A for each i,j. If $A_{i,j} \geq 0.5$ then $A_{i,j}$ is assigned to the $k^{th}$ cluster. Once an $A_{i,j}$ has been assigned it can not be re-assigned, Increment k after each traversal terminates.

To reduce the memory requirements, an affinity matrix may be built on the fly during a depth first traversal. The output assignment matrix may be stored in a sparse matrix data structure.

Extensions to the basic procedure are possible. The clustering behavior can be modified, for example, by changing the affinity function and changing the neighborhood function. In some cases, it is useful to relax the neighborhood function to allow for voxel skipping. This provides a degree of localized clustering for those cases where there are several small disconnected features which form a larger meta feature.

The affinity function may be changed so that a function g can be applied to the fluid map.

$$A_{i,j} = e\left(\frac{-|g(M_i) - g(M_j)|^2}{\sigma^2}\right) \tag{7}$$

One currently available g function averages over a region around the voxel of interest. Another implemented function applies a volume threshold thereby converting the fluid map into a binary image.

In placing the drops on features 804, statistics such as total voxel area, bounding box area, total volume, aspect ratio, etc. can be calculated for each feature. Rules can refer to these statistics of the feature. The user may then exclude or identify different features by writing a set of rules which are processed against each feature.

As described above, the first rule set $r_I$ is used to identify features, or conversely to discard unwanted features. Features that are likely to be discarded may include those that are too small and may be safely ignored, or those that are too large and may be best handled by the standard optimization routine.

The second rule set $r_{nc}$ encodes a heuristic to determine non-convex features. This is typically done by comparing the number of voxels with volume to the total number of voxels in the bounding area of the feature. If a feature is deemed non-concave then it is recursively segmented using a normalized cut version of spectral clustering until all segments or sub-features are concave. Spectral clustering is described by Ng et al. in "On Spectral Clustering: Analysis and Algorithm," Advances in Neural Information Processing Systems 14: 2001, and von Luxburg in "A tutorial on Spectral Clustering," Statistics and Computing, 17 (4) 2007, both of which are hereby incorporated by reference herein.

In some cases, one or more drop locations may be pre-determined. These pre-determined drop locations may be selected based, for example, on defect inspection or on analysis of the imprinting surface. In some cases, defect inspection may be used to find areas that have not filled sufficiently. These results may be used to define pre-determined drop locations to fill the areas as needed, for example, by post-processing or clustering the defect data to find more general areas that have insufficient fluid volumes, and then placing drops at those locations.

In some cases, the distance (norm) function of the optimization routine may be modified to take into account template features. This covers the rotated elliptical Voronoi regions and the volume transition weighting. Other analysis methods (e.g. spectral clustering), may also be used to find features of interest in the fluid map and then have those other algorithms assess where to place drops to fill those features. The optimization routine may then be used to optimize the locations of the remaining drops around those specified locations. In addition, existing semiconductor metrology information (e.g. defect inspection data) may be used to find areas which are not filling properly, assign drops to those areas, and then let the optimization routine optimize the remaining drop locations.

Next, third rule set $r_s$ may be applied to the remaining features to determine the segmentation grid for the feature. The rules can be used to determine the grid that should be mapped onto the feature. A single drop is allocated to each grid location and is initially placed on the volume weighted centroid for that segment. This location is then snapped to a valid location in G and then added to the set of feature drops F.

Block 806 may have generation of the power diagram remain unchanged. However, due to the presence of the feature drops F which cannot move, the nature of the optimization routine is now changed. A minimum energy configuration of the drops is no longer possible and as such two modifications need to be made to the basic procedure described earlier.

The first change is to impose upper and lower limits as shown in equation (8) below on the weight updates shown in equation (4).

$$\lambda_{min} \leq \lambda_{l,i} \leq \lambda_{max} \quad (8)$$

The lower limit is particularly important as it inhibits the maximum diameter of a Voronoi region from exceeding a reasonable limit. Without this limit some regions may become elliptically shaped hulls with the generator centroid at an extrema.

The second modification is related to convergence and selection of the optimal pattern. As a function of time, with limits in place on the generator weights, the system will minimize the sum squared error, which results in the distribution of region sizes being minimized. However this minimization will occur at the expense of the range of region sizes, for which there is no explicit constraint. In many cases this is not necessarily the desired solution since fluid filling is typically limited by the slowest to fill region, typically the drop with the largest volume allocation.

In some cases, additional logic can be placed in the iteration routine to keep a copy of the pareto optimal solution that has been encountered. This pattern minimizes the range of region sizes as well as the variation of region sizes. The objective function in (1) is then effectively:

$$\text{minimize} \sum_{i=1}^{n} \|p_i - z_i\|_2^2 + \max\left(\sum_{k \in \Omega_i} f(M_k)\right) - \min\left(\sum_{k \in \Omega_i} f(M_k)\right) \quad (9)$$

The presence of strong directionally dominant features on the template can affect the flow of the liquid. As described above, the fluid flow was considered to be symmetric, i.e. to flow radially outward from the generator location in all directions equally, appearing as a growing disc from a top view. In some cases, however, template features inhibit symmetrical flow. For example, long narrow gratings, such as those used in crossbar type memories, can create virtual nanochannels where much more fluid flows in the direction of the grating rather than perpendicularly to them. To incorporate this phenomena into the synthesis flow, the definition of the Voronoi region can be extended to include ellipsoids of arbitrary rotation.

$$\frac{x^2}{w^2} + \frac{y^2}{l^2} = 1 \quad (10)$$

To realize this, the norm function of equation (5) is modified to include a coordinate system rotation R and an axis weighing W.

$$\|(x_k - p_i) R_i W_i\|_2 \quad (11)$$

The rotation matrix R is the standard coordinate system where the rotation angle is determined by analyzing the template design (e.g. a "Graphic Data System II" or "GDSII" formatted file) to determine the primary direction of the features in each Voronoi region. Similarly the weighting matrix $W_i$ for each Voronoi region is generated through analysis of the template design, or by utilizing a physical model, to determine where the fluid will likely flow for each drop or generator location.

This formulation can be extended to the power diagram updates, to enforce the volume constraints, by extending the ellipse to the $3^{rd}$ dimension, i.e. making it a cone, and then assuming evaluation at a fixed z of 1.

$$\frac{x^2}{w^2} + \frac{y^2}{l^2} = \frac{1}{\lambda^2} \quad (12)$$

Using equation (12), the matrices used in the norm shown in equation (11) look like the following, $$R_i W_i = \begin{pmatrix} \cos(\theta_i) & -\sin(\theta_i) \\ \sin(\theta_i) & \cos(\theta_i) \end{pmatrix} \begin{pmatrix} \frac{\lambda_i}{w_i} & 0 \\ 0 & \frac{\lambda_i}{l_i} \end{pmatrix}$$

where $\theta_i$, $w_i$, and $l_i$ are determined from the layout.

In some embodiments, a drop pattern may be calculated to include the effect of discrete changes in pattern density (e.g., a change in depth of a feature to be filled with a polymerizable material) to allow rapid, even filling of features. To include the effect of discrete changes in pattern density in a fluid map, the edges in the fluid map are located and an edge map is formed. Thresholds are applied to the edge map. A volume weight is calculated between each generator location and voxel. Calculating the volume weight includes initializing a scale factor (e.g., to 1.0). A line scan is performed from the generator coordinate to the fluid map voxel coordinate. When an edge in the edge map is crossed, the transition type (e.g., lower density to higher density, higher density to lower density) is assessed, and the scale factor is multiplied by a weight associated with the transition type to yield an adjusted scale factor. This may be considered edge weighting. The distance from the generator to the voxel is calculated, and the distance is multiplied by the adjusted scale factor to yield a corrected distance. The corrected distance is used in building the Voronoi diagram or power diagram.

Figure 9A:
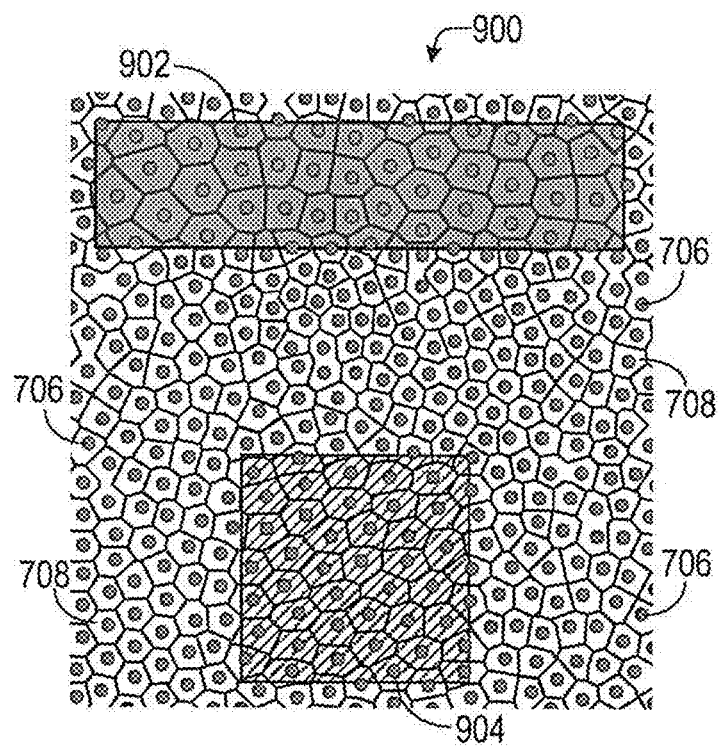
FIG. 9A depicts drop locations in Voronoi regions calculated for a patterned surface without volume transition weighting.
Figure 9B:
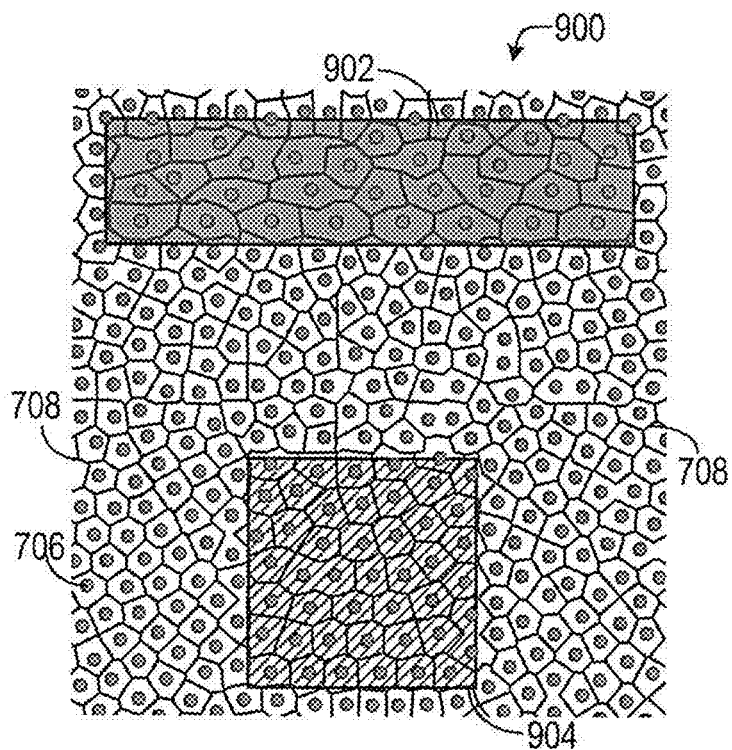
FIG. 9B depicts drop locations in Voronoi regions calculated for a patterned surface with volume transition weighting.

FIG. 9A shows a drop pattern (black dots) and corresponding Voronoi regions (white lines) calculated without volume weighting for a patterned surface. The darker areas of the patterned surface indicate regions of higher density. For example, the dark gray region requires more fluid per unit area to fill the features completely than the lighter gray regions. FIG. 9B shows a drop pattern and corresponding Voronoi regions calculated with volume transition weighting for the same patterned surface.

The embodiments of the present invention described above are exemplary. Many changes and modifications may be made to the disclosure recited above, while remaining within the scope of the invention. Therefore, the scope of the invention should not be limited by the above description, but instead should be determined with reference to the appended claims along with their full scope of equivalents.

What is claimed is:

1. A method of generating a fluid drop pattern, the method comprising:
   selecting a fluid dispense system for dispensing a plurality of drops of a fluid on a substrate;
   selecting an imprinting surface comprising features having a volume; and
   generating an optimized fluid drop pattern of the plurality of drops on the substrate, such that the plurality of drops of the fluid are distributed to locations on the substrate based on a modified Voronoi diagram; wherein generating the optimized fluid drop pattern comprises:
   locating edges in a fluid map corresponding the imprinting surface to form an edge map;
   applying a threshold to the edge map;
   computing a volume weight between a generator point and a volumetric pixel;
   initializing a scaling factor;
   performing a line scan from a generator point to the fluid map volumetric pixel;
   determining a transition type when an edge is crossed;
   multiplying the scaling factor by a weight associated with the transition type;
   calculating a distance from the generator point to the volumetric pixel;
   multiplying the distance by a scale factor to yield a corrected distance; and
   building the modified Voronoi diagram based on the corrected distance.

2. The method of claim 1 wherein the modified Voronoi diagram comprises a weight associated with each generator location in the Voronoi diagram.

3. The method of claim 1 wherein the dispensing comprises delivering from the fluid dispense system a multiplicity of drops of substantially equal volume to the substrate.

4. The method of claim 1, wherein the scaling factor is initialized to about 1.0.

5. The method of claim 1, wherein the optimized fluid drop pattern comprises adjusting drop location based at least in part on a volume of the features.

6. The method of claim 1, further comprising replicating the imprinting surface by substantially filling the features of the imprinting surface with polymerizable material.

7. The method of claim 1, further comprising translating the fluid drop pattern to form a set of shifted fluid drop patterns.

8. The method of claim 7, further comprising superimposing the shifted fluid drop patterns to form a superimposed drop pattern.

\* \* \* \* \*